(12) United States Patent
Kohara et al.

(10) Patent No.: US 6,661,364 B2
(45) Date of Patent: Dec. 9, 2003

(54) SEMICONDUCTOR DEVICE FOR INVERTER CONTROLLING

(75) Inventors: Masaru Kohara, Osaka (JP); Koji Kawamichi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/336,814

(22) Filed: Jan. 6, 2003

(65) Prior Publication Data

US 2003/0128146 A1 Jul. 10, 2003

(30) Foreign Application Priority Data

Jan. 10, 2002 (JP) ........................................ 2002-003247

(51) Int. Cl.[7] .............................................. H03M 1/12
(52) U.S. Cl. ...................................... 341/155; 341/157
(58) Field of Search ................................ 341/143, 157, 341/155

(56) References Cited

U.S. PATENT DOCUMENTS 5,663,729 A  * 9/1997 Wada et al. ................. 341/155

5,745,062 A  * 4/1998 Tavernetti ................... 341/135

FOREIGN PATENT DOCUMENTS

JP          08-272765          10/1996          ........... G06F/15/78

* cited by examiner

Primary Examiner—Peguy JeanPierre
(74) Attorney, Agent, or Firm—McDermott, Will & Emery

(57) ABSTRACT

In a semiconductor device for inverter controlling that includes an AD converter and controls a pulse width of a multi-phase PWM signal on the basis of a digital value obtained by the AD converter, a timer starts counting time in response to a signal supplied from a counter used for generating a PWM signal when the counter has counted a given count value. A timer period of the timer is calculated on the basis of a duty set value stored in a duty set resistor included in a PWM signal generation circuit, and the timer period is stored in a timer period set resistor. The timer generates an AD conversion start factor signal when the timer has counted the timer period stored in the timer period set resistor, and the AD conversion start factor signal is output to the corresponding AD converter so as to start AD conversion. Accordingly, the AD conversion can be definitely started at a time of a predetermined specific ON/OFF combination of the PWM signal.

10 Claims, 17 Drawing Sheets

US 6,661,364 B2

SEMICONDUCTOR DEVICE FOR INVERTER CONTROLLING

BACKGROUND OF THE INVENTION

The present invention relates to a semiconductor device including an AD converter for inverter controlling.

A conventional microcomputer for inverter controlling includes, as shown in FIG. 12, a CPU 1a, a ROM 1b, a RAM 1c, a timer 1d, a serial communication circuit 1e, an I/O port 1f, two AD converters 1g and 1h, a PWM signal generation circuit 1i and the like.

In general, the PWM signal generation circuit 1i used for inverter controlling generates a three-phase PWM (Pulse Width Modulation) signal as shown in FIG. 13. This signal is composed of a PWM signal of three phases, that is, a U-phase, a V-phase and a W-phase respectively having different duties, and an inverted signal of three phases, that is, a /U-phase, a N-phase and a /W-phase. Between the two corresponding phases (namely, between the U-phase and the /U-phase, the V-phase and the N-phase or the W-phase and the /W-phase), a predetermined time at which neither of these two phases are ON (i.e., a dead time) is provided.

A variety of configurations of the PWM signal generation circuit 1i are known, and the circuit generally includes a counter, a comparator and the like. An exemplified configuration is shown in FIG. 14. In the configuration shown in FIG. 14, the PWM signal generation circuit includes a counter 3, a carrier set resistor 4 for storing the maximum count value (carrier set value) of the counter 3, and a comparator 5 for comparing a current count value of the counter 3 with the carrier set value. As shown in FIG. 13, when the current count value of the counter 3 accords with the carrier set value or 0 (zero), the comparator 5 inverts the operation of the counter 3 from an up-counting operation to a down-counting operation or vice versa.

The PWM signal generation circuit 1i of FIG. 14 further includes a phase circuit 6u. Although merely the phase circuit 6u for the U-phase is shown in FIG. 14, phase circuits having the same configuration are provided with respect to the V-phase and the W-phase. The phase circuit 6u includes a duty set resistor 7u for storing a duty set value U shown in FIG. 13, a comparator 8u for comparing the count value of the counter 3 with the duty set value U stored in the duty set resistor 7u, a flip-flop circuit 9u for inverting the PWM signal between the U-phase and the /U-phase in response to a signal supplied from the comparator 8u when the count value of the counter 3 accords with the duty set value U, and a dead time inserting circuit 10u for inserting the dead time between the U-phase and the /U-phase of the PWM signal.

The microcomputer 1 for inverter controlling including this PWM signal generation circuit 1i is used for controlling an inverter device for driving a motor M, for example, as shown in FIG. 15. Specifically in FIG. 15, the microcomputer 1 for inverter controlling outputs the six phases of the PWM signal generated by the PWM signal generation circuit 1i included therein to corresponding driving transistors 15u, 15/u, 15v, 15/v, 15w and 15/w via the I/O port 1f of FIG. 12, so as to control the rotating rate and the like of the motor M. For this control, the various states of the motor M, such as the position of a rotor, the value of a current supplied to the motor M and the voltage value of the current, are measured with sensors 16 and 17 for successively changing the duty set value stored in the duty set resistor (7u for the U-phase) of each phase in accordance with the measured values, so as to finely determine the pulse width of each phase of the PWM signal.

Accordingly, it is indispensable for fine control of the motor M to precisely measure the current value and the like with the sensors 16 and 17. In the case where the current supplied to the motor M is measured by using the sensor 16 or 17, timing for starting AD conversion with the AD converter 1g or 1h included in the microcomputer 1 for inverter controlling of the value measured by using the sensor 16 or 17 is significant. Conventionally, in order to subject the output value of the sensor 16 or 17 resulting from measuring the supplied current value of the motor M to the AD conversion, a microcomputer for inverter controlling having a function to automatically start the AD conversion in synchronization with the count value of the counter 3 periodically at given intervals as shown in FIG. 16 is also generally used. The configuration of an AD converter included in the microcomputer having such a function is shown in FIG. 17.

FIG. 17 is a block diagram for showing the internal configuration of, for example, the AD converter 1g shown in FIG. 12. In FIG. 17, a register ADCTR1ga is an AD conversion control register for controlling the AD conversion. In this register ADCTR1ga, a bit ADST (i.e., the 7th bit) controls the start of the AD conversion, and when this bit value is changed from "0" to "1", an analog-digital conversion circuit 1gb is operated for starting the AD conversion. Other bits for controlling the AD conversion are allocated to the other bits 0 through 6 of the register ADCTR1ga. In this configuration, either a write signal from the CPU or a signal corresponding detection of underflow or overflow of the counter 3 is selected as a signal for setting the value of the bit ADST in FIG. 17. In the case where the detection signal for the underflow or overflow of the counter 3 is selected, the AD conversion is started at the timing of the underflow or overflow of FIG. 13 in synchronization with the underflow or overflow.

The present inventors have examined at what timing the current value of the motor should be measured. In the case where the six-phase PWM signal is used, current flow to the motor M is different among time periods A, B, C and D of FIG. 13 because the ON/OFF combinations of the three phases, i.e., the U-phase, the V-phase and the W-phase, of the PWM signal are different among these three periods. For example, in the time period B, the U-phase and the W-phase of the PWM signal are OFF and the V-phase of the PWM signal is ON, and hence, a current from the V-phase to the U-phase and W-phase flows to the motor M. On the other hand, in the time period C, the U-phase and the V-phase of the PWM signal are ON and the W-phase of the PWM signal is OFF, and hence, a current from the U-phase and V-phase to the W-phase flows to the motor M. Accordingly, in order to finely measure the current value of the motor M, it is desired to measure it in one or a plurality of the time periods A, B, C and D at which a current flows to the motor M differently.

In the conventional microcomputer for inverter controlling, when the measured current value of the motor M is to be subjected to the AD conversion in at least one of the time periods A, B, C and D, it is necessary to control the start of the AD conversion by using the CPU 1a. For this control by using the CPU 1a, the following three software interruption processing are necessary: Processing for measuring start timing of the AD conversion (which is specifically processing for starting the timer at the underflow of the counter 3); AD conversion start processing (namely, processing for setting the bit ADST of the AD conversion control register ADCTR1ga to "1"); and processing for obtaining an AD conversion value. There recently is a trend in using merely one microcomputer for simultaneously performing not only the motor control but also other control such as power control and system control. Therefore, any of the three interruption processing may be delayed due to the priority level in the control. In such a case, the start timing for the AD conversion can be shifted, so that a precise current value cannot be obtained. On the other hand, when the three interruption processing are priorly performed, there arises a problem that other control such as the system control may be delayed.

SUMMARY OF THE INVENTION

An object of the invention is, in a semiconductor device for inverter controlling including a PWM signal generation circuit, definitely starting AD conversion of a value measured with a sensor at desired start timing.

In order to achieve the object, according to the invention, the AD conversion of a value measured with a sensor is definitely started at desired start timing by using a hardware device.

Specifically, the semiconductor device for inverter controlling of this invention includes a PWM signal generation circuit including a counter and a duty set resistor for generating a multi-phase PWM signal; an AD converter for converting an input analog signal into a digital signal, a pulse width of the PWM signal generated by the PWM signal generation circuit being controlled on the basis of the digital signal obtained through AD conversion by the AD converter; timer means for automatically start counting time in response to a signal supplied from the counter when the counter has a given count value; and AD conversion start factor generating means for generating an AD conversion start factor for activating the AD converter at a time of a particular ON/OFF combination of the PWM signal when the timer means has counted a set timer period.

In one aspect of the semiconductor device for inverter controlling of the invention, the AD converter is plural in number, and the AD conversion start factor is generated by the AD conversion start factor generating means at each of the time of the particular ON/OFF combination of the PWM signal and a time of at least another particular ON/OFF combination of the PWM signal.

In another aspect of the semiconductor device for inverter controlling of the invention, the timer period of the timer means is calculated on the basis of a duty set value set in the duty set resister, and the AD conversion start factor generating means includes timer period storing means for storing the calculated timer period of the timer means.

In another aspect of the semiconductor device for inverter controlling of the invention, the AD conversion start factor generating means includes the timer means and the timer period storing means respectively in number the same as that of the AD converters, and each of the timer means generates the AD conversion start factor to be output to the corresponding one of the AD converters when the timer means has counted the timer period stored in the corresponding one of the timer period storing means.

In another aspect of the semiconductor device for inverter controlling of the invention, in the AD conversion start factor generating means, the number of the timer means is one and the number of the timer period storage means is the same as that of the AD converters, the AD conversion start factor generating means further includes comparing means in number the same as that of the timer period storing means, and each of the comparing means compares the timer period stored in the corresponding one of the timer period storing means with a count value of the timer means, and generates the AD conversion start factor to be output to the corresponding one of the AD converters when the timer period and the count value compared accord with each other.

In another aspect, the semiconductor device for inverter controlling of the invention further includes original timer means, and the original timer means works as the timer means of the AD conversion start factor generating means.

In another aspect of the semiconductor device for inverter controlling of the invention, in the AD conversion start factor generating means, the number of the timer period storing means is the same as that of the AD converters, the AD conversion start factor generating means further includes comparing means in number the same as that of and correspondingly to the timer period storing means, and each of the comparing means compares the count value of the counter for generating a PWM signal included in the PWM signal generation circuit with the timer period stored in the corresponding one of the timer period storing means, and generates the AD conversion start factor to be output to the corresponding one of the AD converters when the count value and the timer period compared accord with each other.

In another aspect, the semiconductor device for inverter controlling of the invention further includes a CPU, and the CPU calculates the timer period stored in the timer period storing means on the basis of the duty set value set in the duty set resister.

In another aspect, the semiconductor device for inverter controlling the invention further includes timer period setting means that receives, from the duty set resistor included in the PWM signal generation circuit, a signal corresponding to the duty set value set in the duty set resistor, determines the timer period of the timer means on the basis of the duty set value, and stores the timer period in the timer period storing means.

Alternatively, the semiconductor device for inverter controlling of this invention includes a PWM signal generation circuit including a counter, a duty set resistor and a dead time inserting circuit for generating a multi-phase PWM signal; an AD converter for converting an input analog signal into a digital signal, a pulse width of the PWM signal generated by the PWM signal generation circuit being controlled on the basis of the digital signal obtained through AD conversion by the AD converter, and a dead time being inserted into an identical phase of the PWM signal generated by the PWM signal generation circuit; delay inserting means that receives an output of the dead time inserting circuit and generates an AD conversion start factor to be output to the AD converter when a set time period has elapsed from insertion of the dead time.

As a result, according to the invention, when the counter for generating a PWM signal ends, for example, a down-counting operation, the timer means receives an underflow signal from the counter in the AD conversion start factor generating means, so as to automatically start the time count. Thereafter, when the set timer period has been counted, an AD conversion start factor is generated so as to activate the AD converter. Therefore, when the set timer period of the timer means is set to a desired time of a specified ON/OFF combination of the multi-phase PWM signal, the AD conversion of a value measured with a sensor can be started at a desired timing. Accordingly, the measured value of the sensor can be precisely obtained. In addition, since there is no need to perform interruption processing such as timer start processing and AD conversion start processing after counting a predetermined time, the burden of the CPU can be reduced, so that delay in other controls such as temperature control performed by the CPU can be effectively suppressed.

In particular, when a plurality of AD converters are used in this invention, a desired plurality of timer periods of the timer means can be set. Accordingly, since the AD conversions respectively performed by the plural AD converters can be independently started, even when the start timing of the AD conversions are very close to each other, the respective AD conversions can be started definitely at the respective start timings.

Furthermore, since the number of timer means additionally provided in this invention can be limited to one, cost reduction and downsizing can be realized.

In addition, since the counter for generating a PWM signal can be used also as the timer means additionally provided in this invention, there is no need to separately provide the timer means.

Moreover, according to the invention, when the duty set value is set in the duty set resistor of the PWM signal generation circuit, the timer period setting means automatically sets the timer period of the timer means on the basis of the duty set value. Therefore, the burden of the CPU can be further reduced as compared with the case where the CPU sets the timer period.

Alternatively, the invention utilizes the fact that when a dead time is inserted into the same phase of the PWM signal by the dead time inserting circuit, the ON/OFF combinations of the respective phases of the PWM signal obtained after the insertion are changed and different from those obtained before the insertion. As a result, an AD conversion start factor is generated by the delay inserting means after a set time has elapsed from the insertion of the dead time, so that the AD converter can be activated at this time point. Therefore, when the set time (delay time) of the delay inserting means is set to a desired time, a value measured with a sensor can be automatically subjected to the AD conversion without using the CPU at a time of an arbitrary ON/OFF combination of the PWM signal.

DETAILED DESCRIPTION OF THE INVENTION

Preferred embodiments of the invention will now be described with reference to the accompanying drawings.

Embodiment 1

Figure 1:
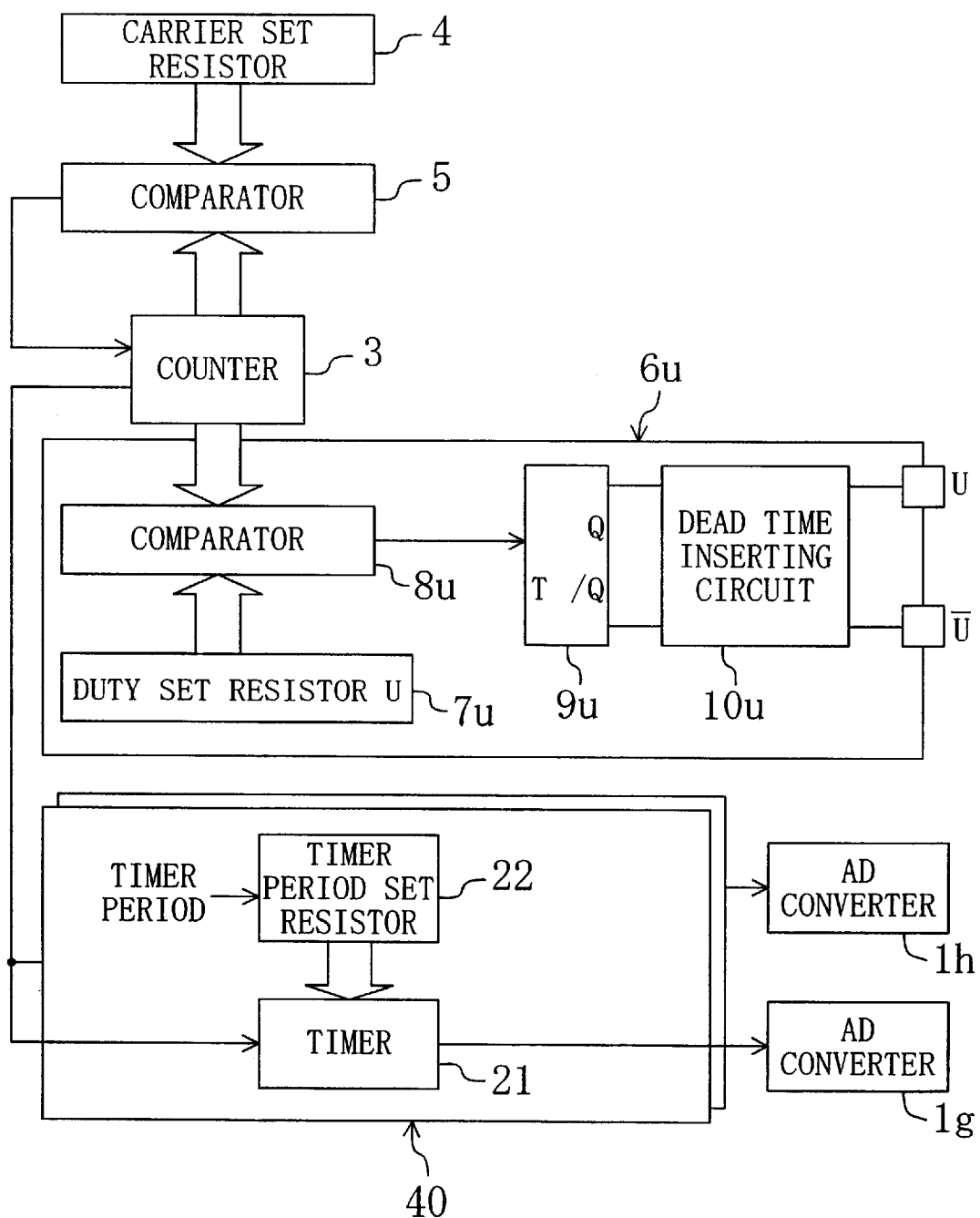
FIG. 1 is a diagram for showing the internal configuration of a PWM signal generation circuit included in a semiconductor device for inverter controlling according to Embodiment 1 of the invention.
Figure 12:
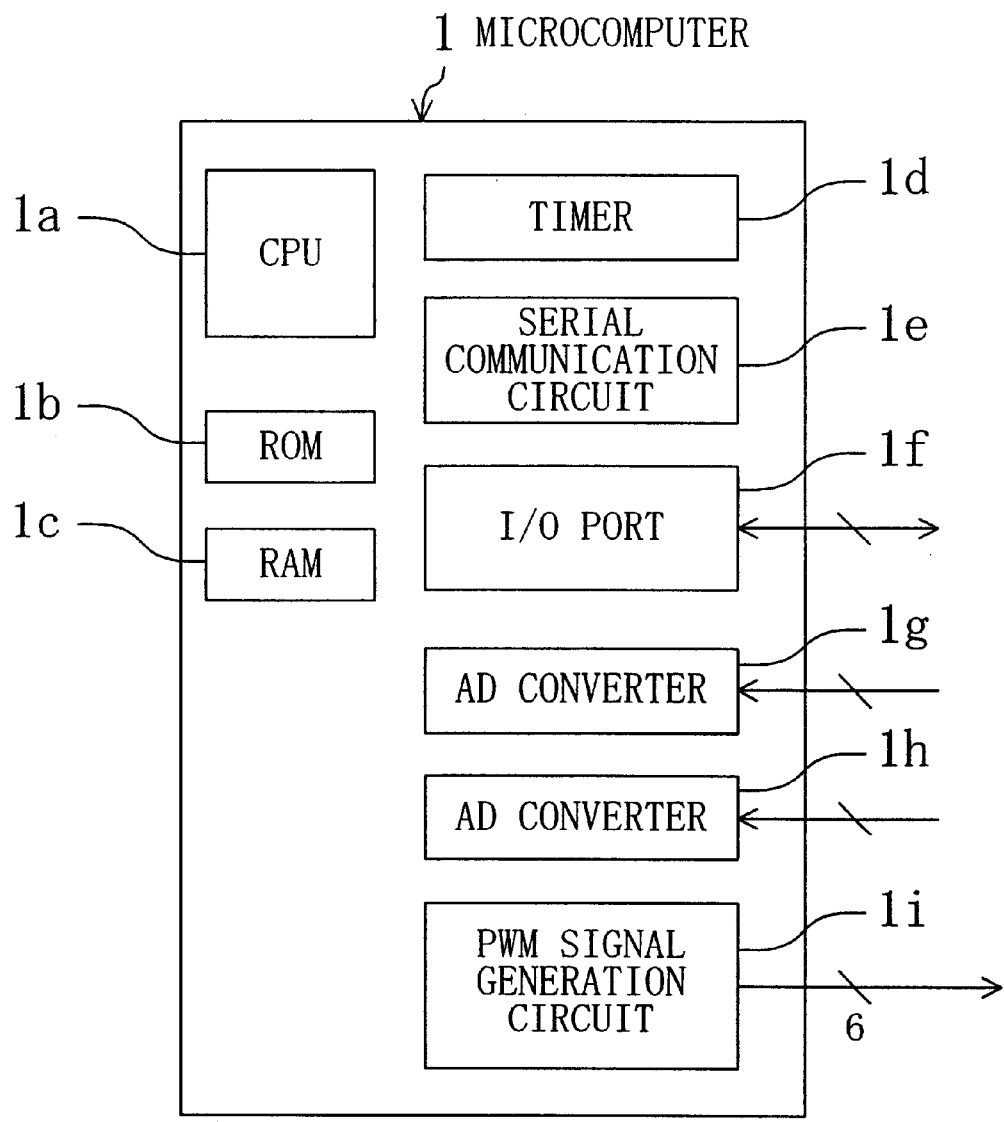
FIG. 12 is a diagram for showing an exemplified basic configuration of a semiconductor device (microcomputer) for inverter controlling.

FIG. 1 is a block diagram of a PWM signal generation circuit included in a microcomputer for inverter controlling according to Embodiment 1 of the invention. The whole structure of the microcomputer for inverter controlling of this embodiment is identical to that described above with reference to FIG. 12 and hence the description is omitted.

Figure 14:
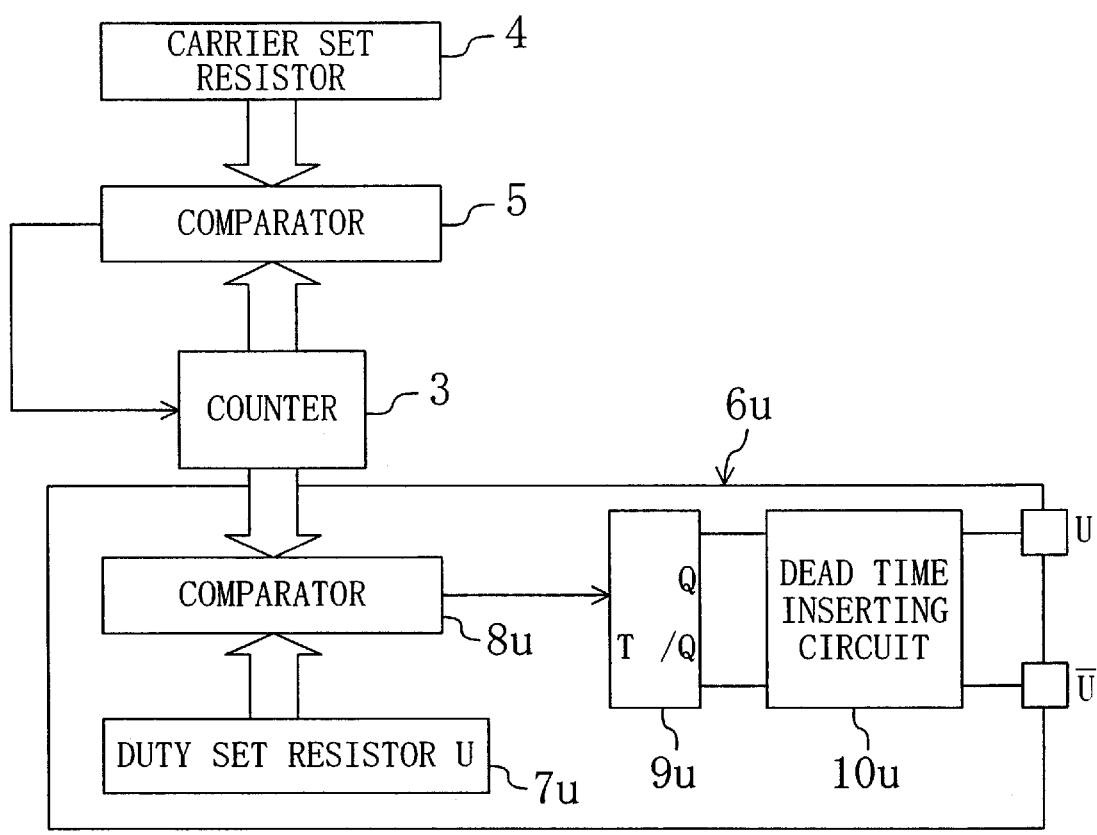
FIG. 14 is a diagram for showing an exemplified conventional PWM signal generation circuit.
Figure 15:
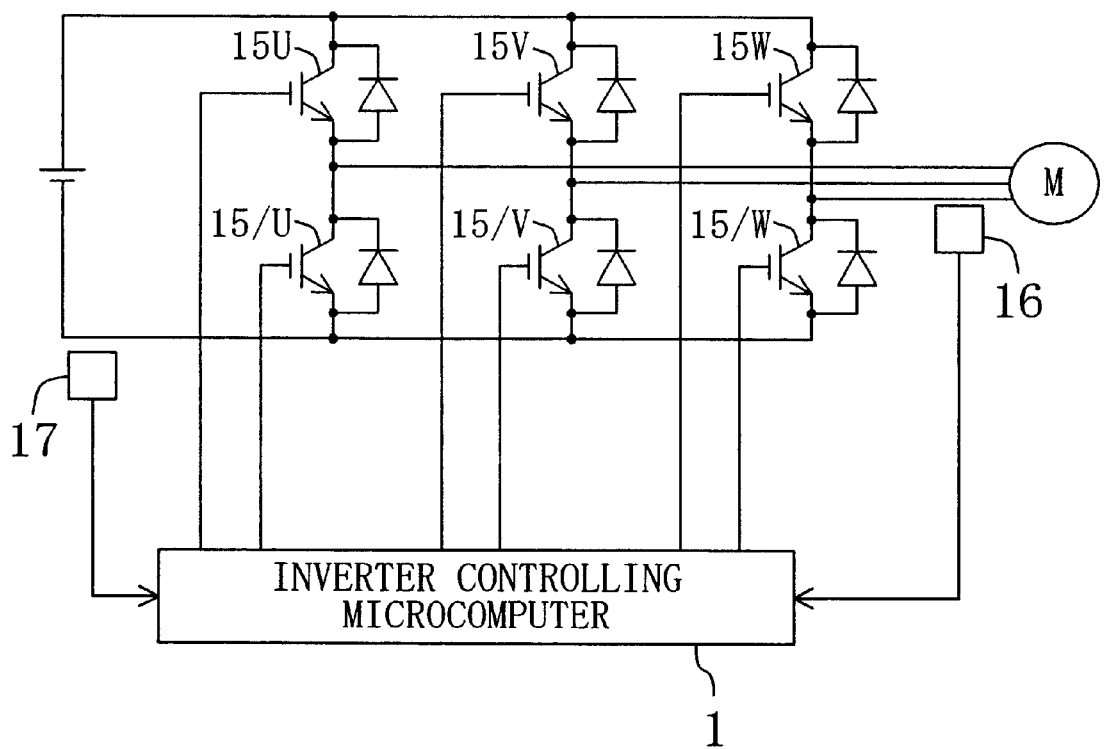
FIG. 15 is a diagram for showing an exemplified configuration of an inverter control circuit.
Figure 16:
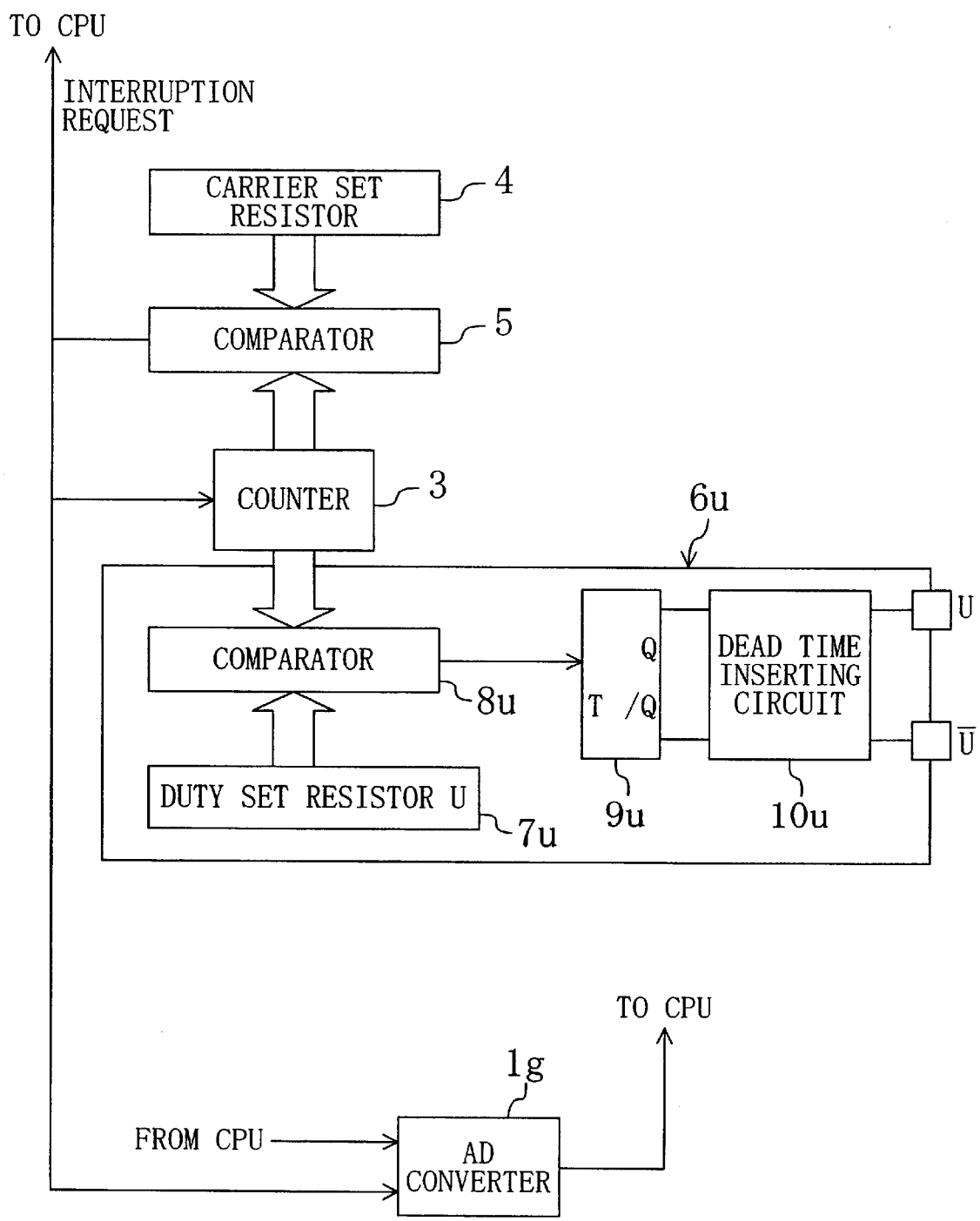
FIG. 16 is a diagram for showing an exemplified configuration of a conventional PWM signal generation circuit and a control system for AD conversion.
Figure 17:
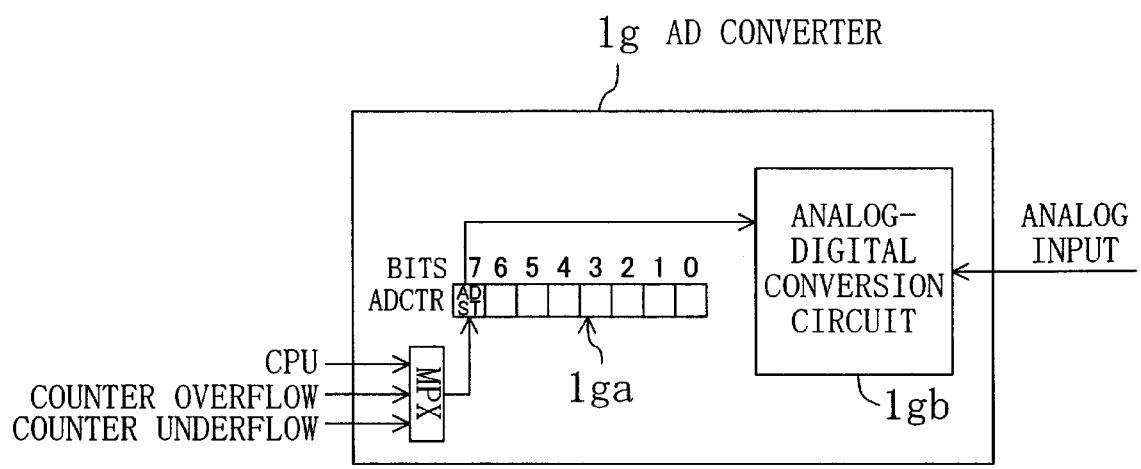
FIG. 17 is a diagram for showing the internal configuration of an AD converter used in the conventional semiconductor device for inverter controlling.

The PWM signal generation circuit 1$i$ of FIG. 1 includes, in addition to the elements of the conventional PWM signal generation circuit shown in FIG. 14, a timer 21 and a timer period set resister 22. The timer 21 and the timer period set resistor 22 correspond to the AD converter 1$g$ included in the microcomputer for inverter controlling shown in FIG. 12, and the AD converter 1$g$ converts an analog current value measured by using the sensor 16 or 17 shown in FIG. 15 into a digital value. The AD converter 1$h$ included in the microcomputer for inverter controlling shown in FIG. 12 converts an analog current value measured by using the sensor 17 or 16 shown in FIG. 15 into a digital value. A timer and a timer period set resistor are also provided correspondingly to this AD converter 1$h$ similarly to the AD converter 1$g$.

Figure 13:
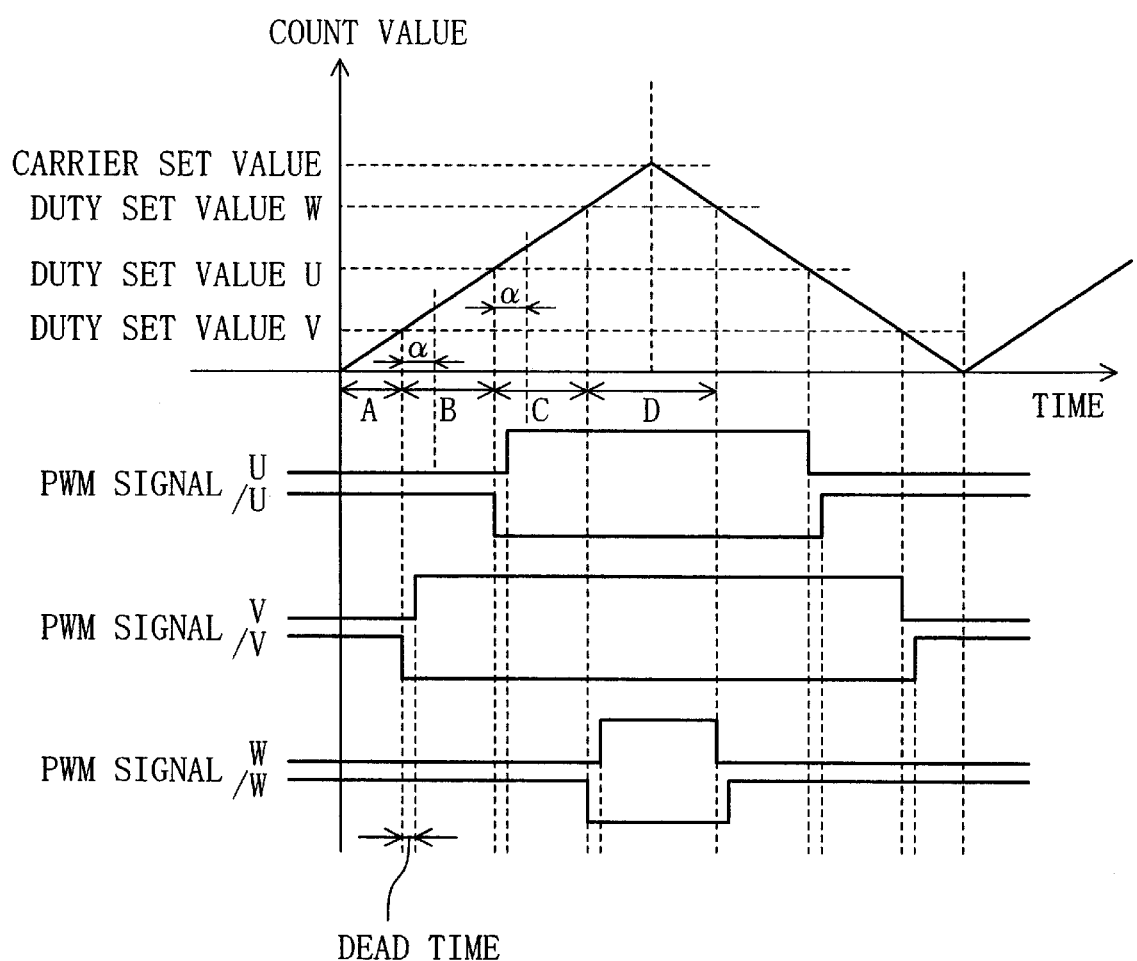
FIG. 13 is a diagram for showing generation of a PWM signal by using the semiconductor device for inverter controlling.

Each timer (timer means) 21 receives an underflow signal from the counter 3 when the count value of the counter 3 is zero (a predetermined value), so as to automatically start counting time in synchronization with the underflow signal. Also, each timer period set resister 22 stores a period from the start to the end of the count of the corresponding timer 21, namely, a timer period. In the case where one timer 21 ends the time count at predetermined timing after switching an ON/OFF combination of the multiphase PWM signal, for example, in the time period B of FIG. 13, the timer period is set, on the basis of the duty set value V stored in the duty set resistor for the V-phase, to a time obtained by adding a predetermined time α to a time elapsed until the count value of the counter 3 reaches the duty set value V. Similarly, the timer period of the timer period set resistor 22 corresponding to the AD converter 1h is set to a time obtained by adding the predetermined time α to a time elapsed until the count value reaches the duty set value U stored in the duty set resister 7u for the U-phase, so that the corresponding timer 21 can end the time count in, for example, the time period C. These timer periods are on the basis of any of the duty set values, and may be obtained by subtracting a predetermined time β. For example, the timer period may be set to a time obtained by subtracting the predetermined time β from a time elapsed until the count value reaches the duty set value U stored in the duty set resistor 7u for the U-phase, so that the timer 21 can end the time count in the time period B. These timer periods are calculated by the CPU 1a, so as to be stored in the respective timer period set resisters (timer period storing means) 22. The values of the predetermined times α and β are given in accordance with an instruction from the CPU, so that the PWM signal generation circuit can be applicable to a driving circuit of any type of motor M and equipment to be controlled in accordance with the characteristics of the driving transistors 15u through 15/w that receive the PWM signal.

Figure 11:
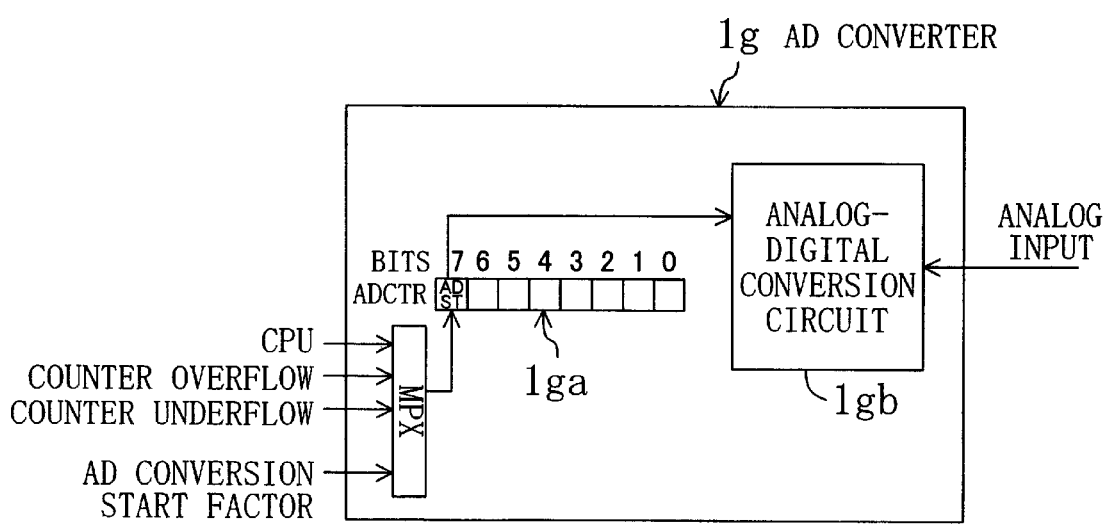
FIG. 11 is a diagram for showing the internal configuration of an AD converter used in the semiconductor device for inverter controlling of the invention.

When each timer 21 ends the time count, the output signal of the timer is supplied to the corresponding AD converter 1g or 1h as a signal corresponding to an AD conversion start factor. As exemplified as the AD converter 1g in FIG. 11, in the AD converter 1g or 1h, the AD conversion start factor as well as the interruption instruction from the CPU 1a and the underflow or overflow signal of the counter 3 as in the conventional technique are input to the AD conversion control resister ADCTR1ga, so as to change the value of the 7th bit ADST from "0" to "1". Thus, the analog-digital conversion circuit 1gb included therein is operated for starting the AD conversion.

Each of the AD converter 1g or 1h and the corresponding timer 21 and timer period set resister 22 together construct AD conversion start factor generating means 40 in which the AD conversion start factor is generated in accordance with a specified ON/OFF combination of the PWM signal obtained when the timer 21 counts the set timer period stored in the timer period set resister 22 for activating the corresponding AD converter 1g or 1h.

Figure 2:
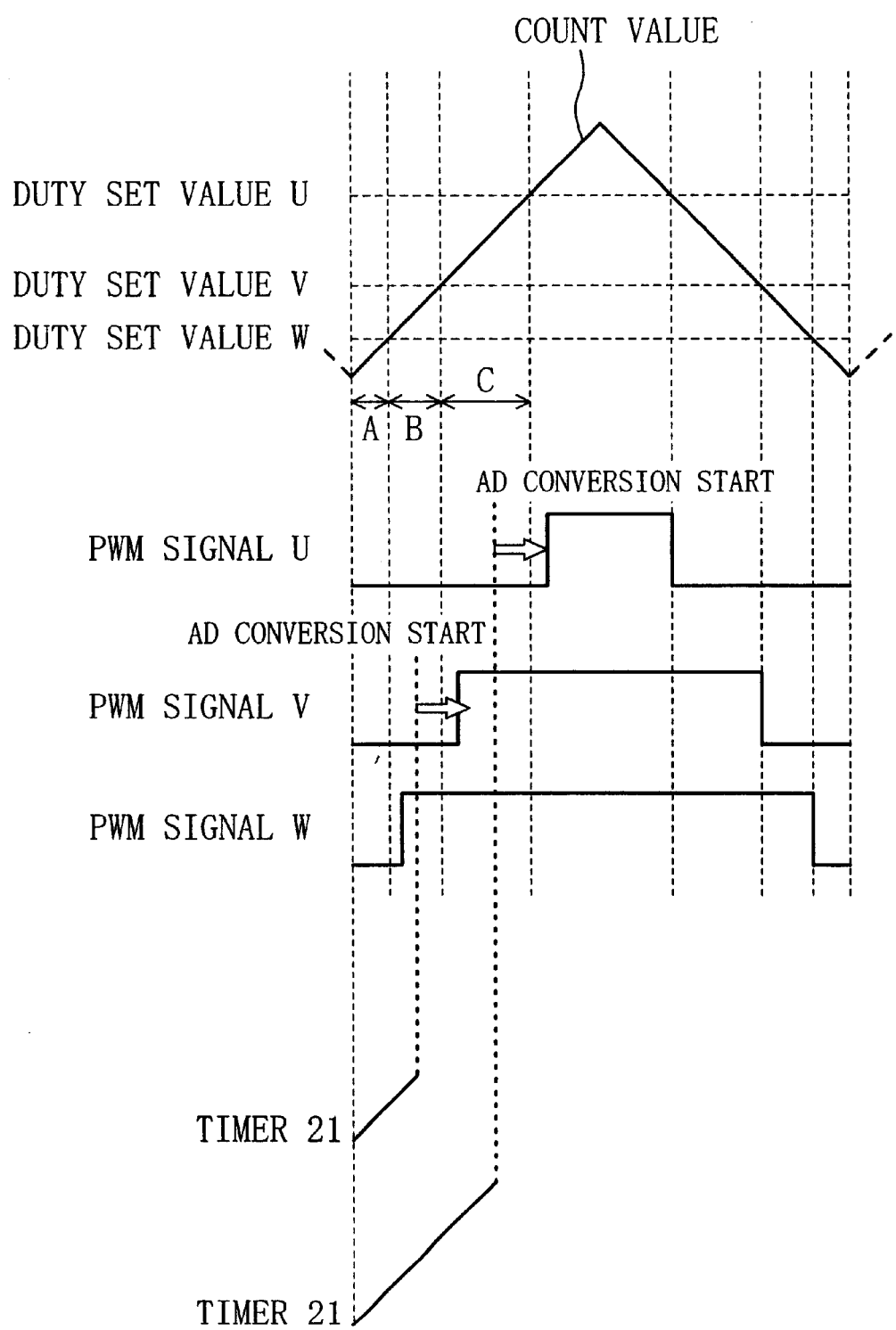
FIG. 2 is a timing chart of a PWM signal and AD conversion in the PWM signal generation circuit of FIG. 1.

Next, the operation of the microcomputer for inverter controlling of this embodiment will be described with reference to FIG. 2. When the counter 3 ends the down-counting operation and outputs an underflow signal, each timer 21 starts the time count. When the timer 21 counts the timer period stored in the corresponding timer period set resister 22, the timer 21 generates the AD conversion start factor, which is output to the corresponding AD converter 1g or 1h so as to operate the analog-digital conversion circuit 1gb therein. As a result, the start timing of the AD conversion is within a desired time period (for example, B or C), so that the value of a current supplied to the motor M can be precisely obtained. The current value of the motor M thus obtained is used for controlling the pulse width of the PWM signal in the next period.

Figure 10:
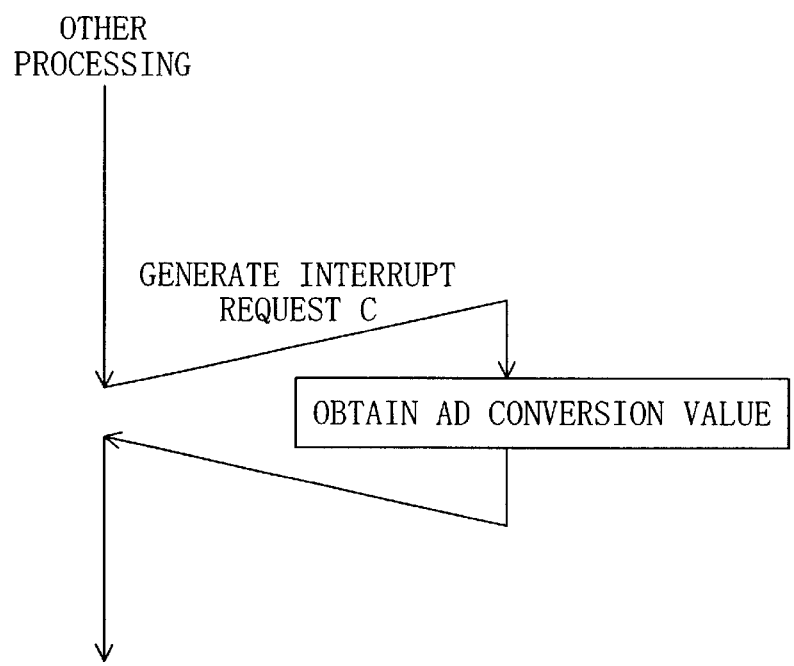
FIG. 10 is a diagram for showing CPU processing for AD conversion performed by using a semiconductor device for inverter controlling of the invention.
Figure 18:
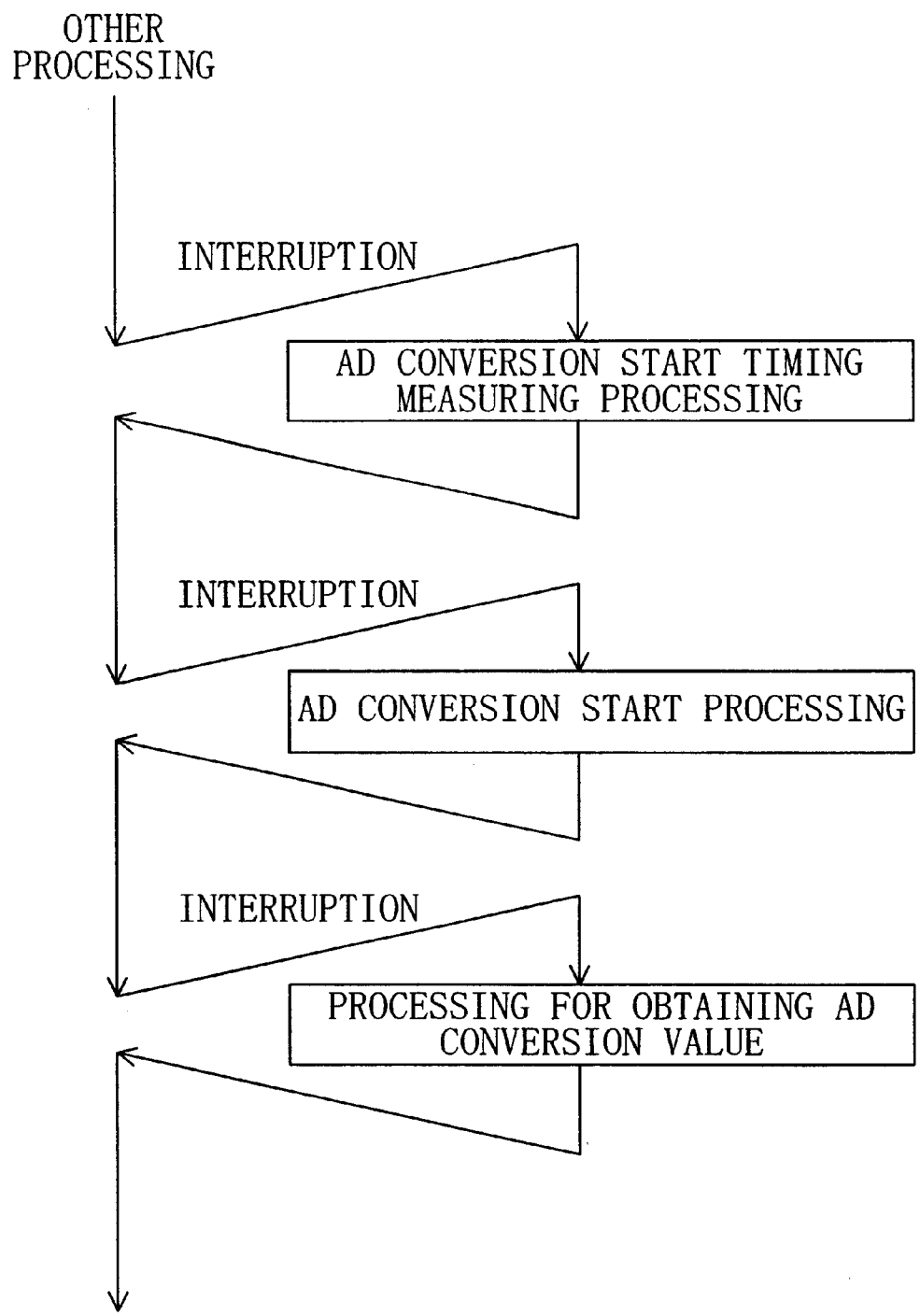
FIG. 18 is a diagram for showing CPU processing for AD conversion performed by using the conventional semiconductor device for inverter controlling.

In addition, in this embodiment, the processing performed by the CPU 1a for obtaining the supplied current value of the motor M is merely software processing for interruption for obtaining an AD conversion value as shown in FIG. 10, and the software processing for the interruption for the AD conversion start timing measuring processing (timer start processing) and the AD conversion start processing that are conventionally necessary as shown in FIG. 18 are not necessary. Accordingly, even when the CPU 1a also performs all of the motor control, the power control and the system control, delay in the power control and the system control other than the motor control can be effectively suppressed.

Furthermore, each of the AD converter 1g and 1h performs the AD conversion independently in this embodiment. Therefore, even when the AD conversion start timings are very close to each other within the time period B or C of FIG. 13, the AD conversions can be respectively performed definitely at the two AD conversion start timings, and time required for completing all the AD conversions can be shortened. Also, the timer 21 additionally included in this embodiment is a simple timer for counting time, and hence, it can be easily realized because the timer 1d originally included in the microcomputer for inverter controlling can be used as the timer 21.

Embodiment 2

Figure 3:
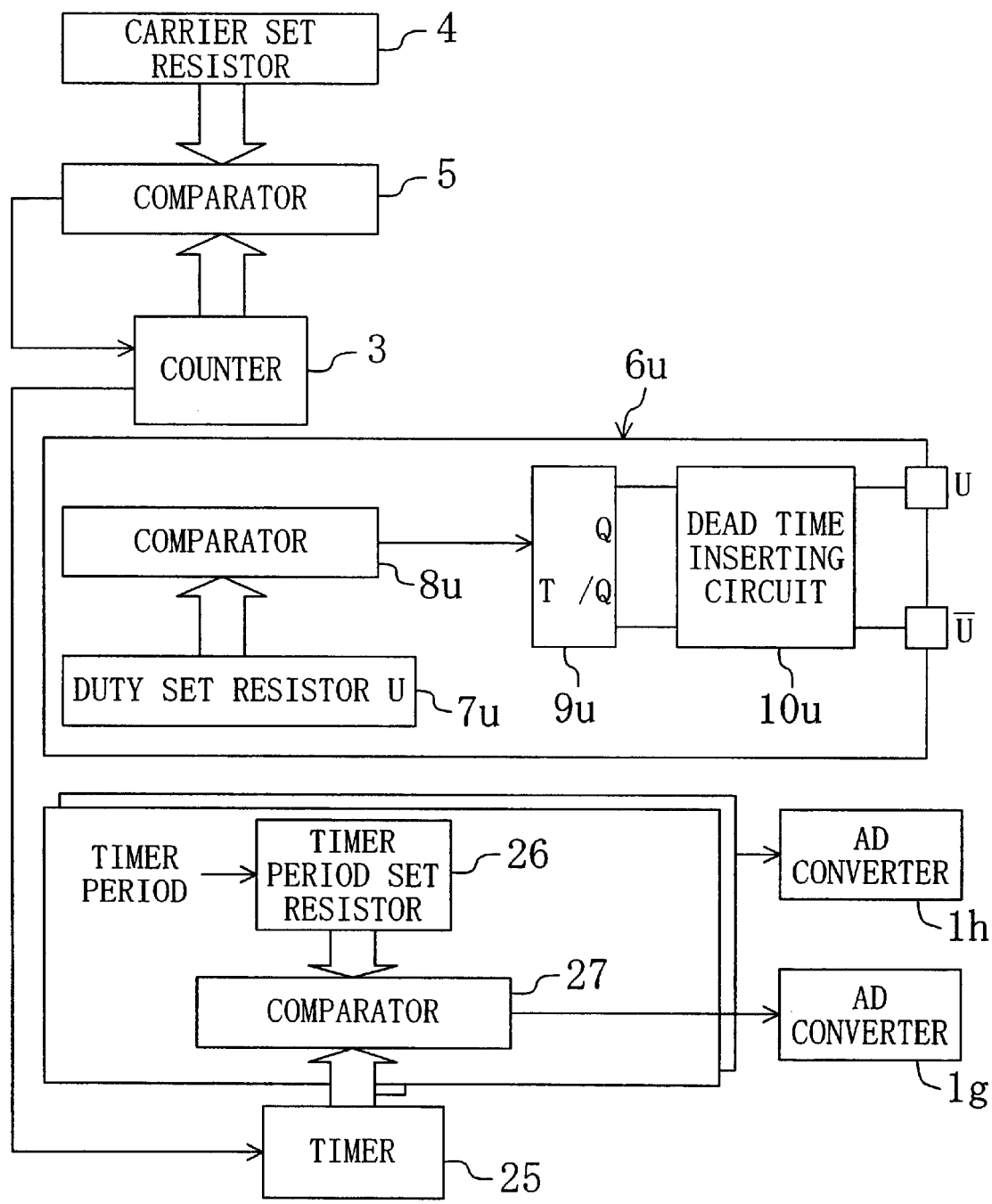
FIG. 3 is a diagram for showing the internal configuration of a PWM signal generation circuit included in a semiconductor device for inverter controlling according to Embodiment 2 of the invention.

Embodiment 2 of the invention will now be described. FIG. 3 shows the internal configuration of a PWM signal generation circuit according to this embodiment. In this embodiment, a timer additionally included is shared between a plurality of AD converters. In and after this embodiment, the whole configuration of a microcomputer for inverter controlling including the PWM signal generation circuit is identical to that shown in FIG. 12 and hence the description is omitted.

In the PWM signal generation circuit of FIG. 3, one timer (timer means) 25 is shared between a plurality of (two) AD converters 1g and 1h. A timer period set resister 26 and a comparator 27 are provided correspondingly to the AD converter 1g. Although not shown in the drawing, a timer period set resister and a comparator are provided also correspondingly to the AD converter 1h. The one shared timer 25 starts the time count in response to an underflow signal from the counter 3.

The count value of the timer 25 is output to each comparator 27. Each comparator (comparing means) 27 compares the timer period stored in the corresponding timer period set resister 26 with the count value of the timer 25. When the timer period accords with the count value, the comparator 27 outputs a signal corresponding to an AD conversion start factor to the corresponding AD converter 1g or 1h. Thus, the bit ADST of the AD conversion control resister ADCTR1ga included in the corresponding AD converter 1g or 1h is set to "1", so as to operate the analog-digital conversion circuit 1gb therein. Similarly to the timer period set resister 22 of Embodiment 1, the timer period stored in each timer period set resister 26 is set by the CPU 1a to a timer period determined on the basis of the duty set value stored in any of the duty set resisters (for example, the duty set resistor 7u for the U-phase) in accordance with the duty set value and the predetermined time α or β.

Figure 4:
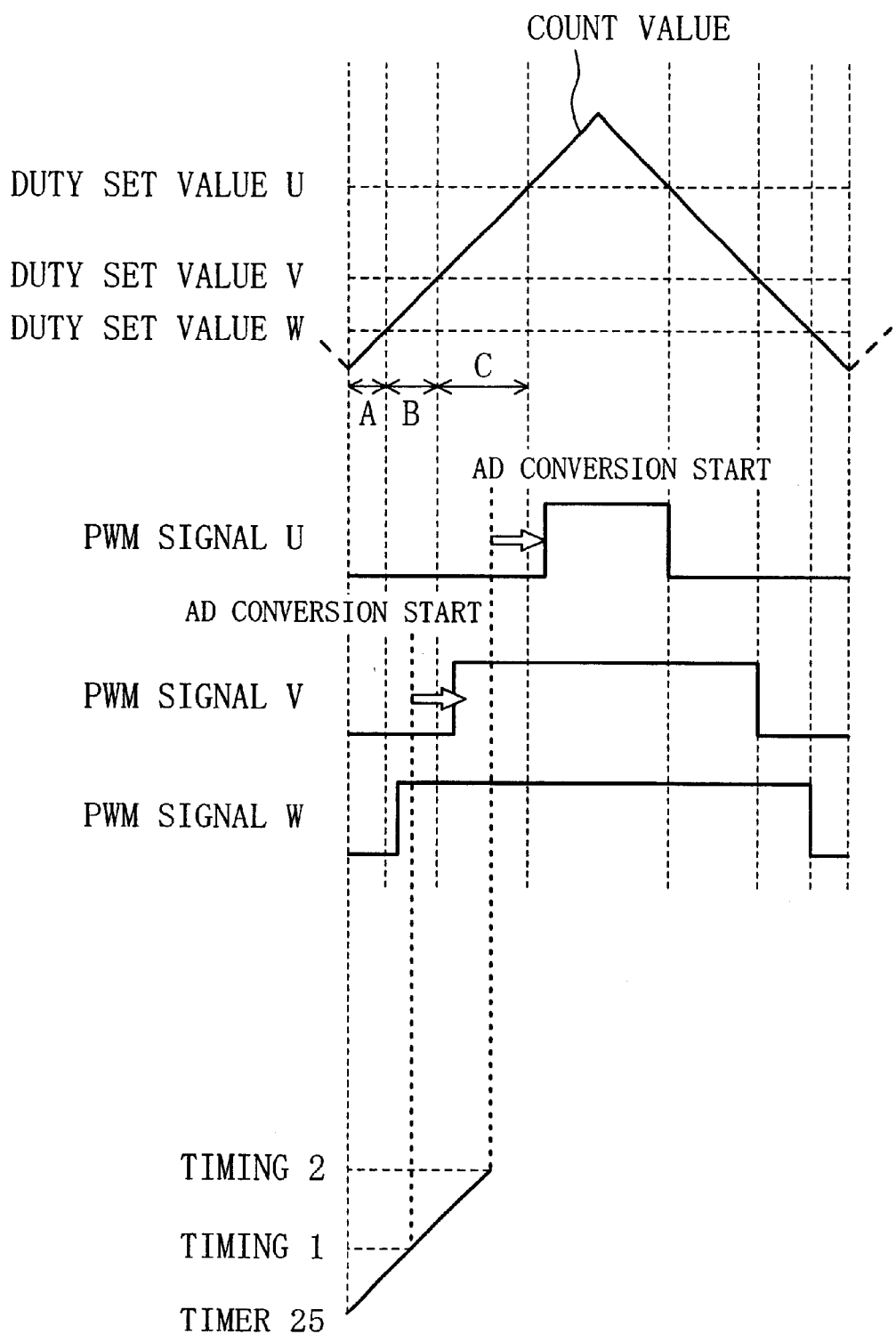
FIG. 4 is a timing chart of a PWM signal and AD conversion in the PWM signal generation circuit of FIG. 3.

Accordingly, in this embodiment, similarly to Embodiment 1, the start timing of the AD conversion by the AD converter 1g or 1h precisely accords with predetermined time in a desired time period (for example, B or C) set in the timer period set resister 26 as is understood from FIG. 4, so as to precisely obtain a supplied current value of the motor M. Also, the software processing for the interruption of the AD conversion start timing measuring processing and the AD conversion start processing are not necessary, so that the delay of the power control and the system control other than the motor control can be effectively suppressed.

Moreover, since the counter 3 generally has a structure for outputting an underflow signal, there is no need in this embodiment to change the basic configuration of the PWM signal generation circuit shown in FIG. 14, resulting in shortening time required for development of the product.

In addition, although it is necessary to provide the comparators 27 respectively correspondingly to the AD converters 1g and 1h, the timer 25 additionally included is shared between the AD converters 1g and 1h. Thus, merely one timer, which is more expensive and larger than the comparator 27, is necessary, and therefore, the cost and the size of the PWM signal generation circuit can be advantageously reduced as compared with those of Embodiment 1. Accordingly, in consideration of all the technical effects, the time required for development of the product and the product cost, this embodiment is suitable for commercialization.

Embodiment 3

Figure 5:
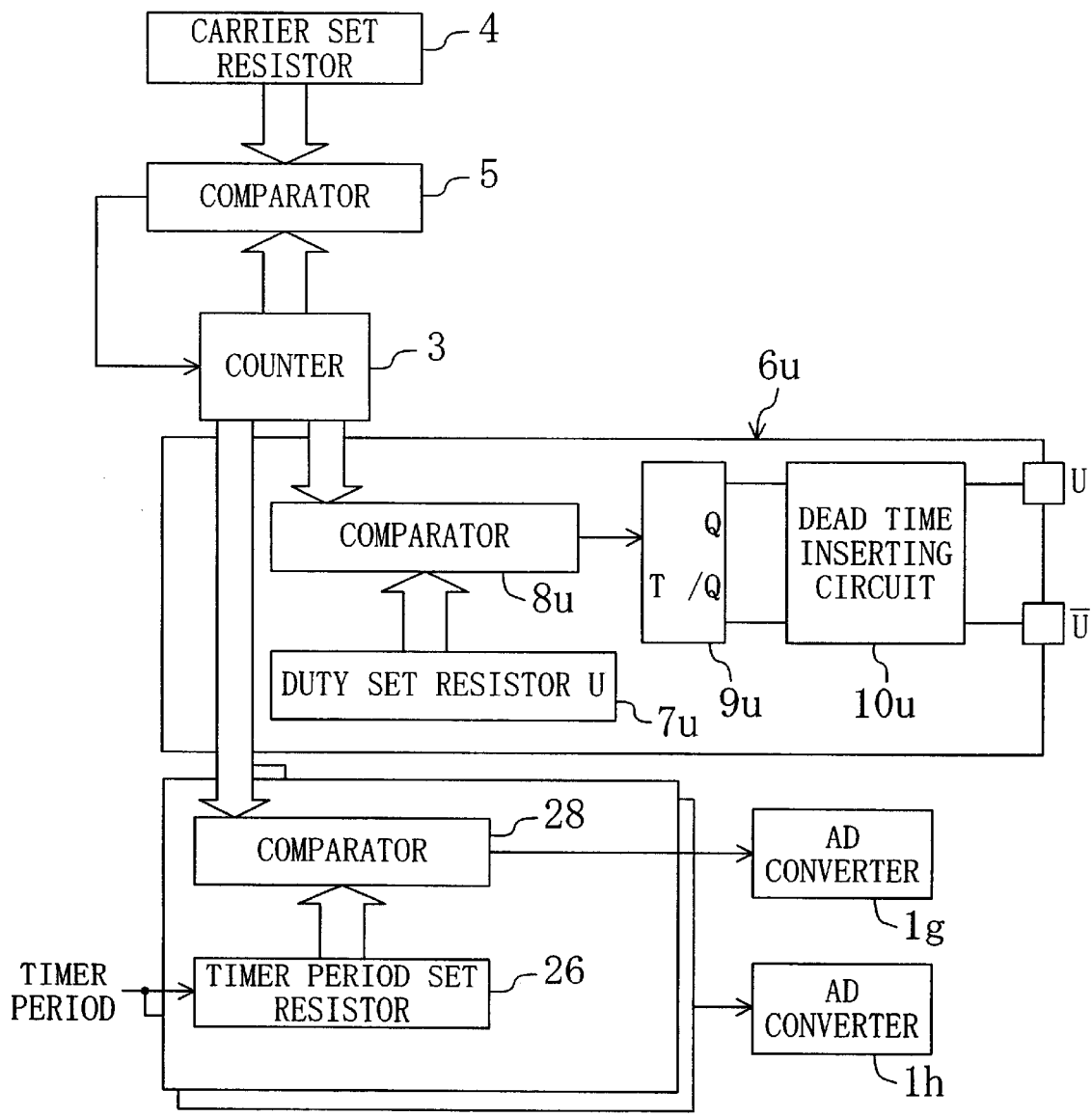
FIG. 5 is a diagram for showing the internal configuration of a PWM signal generation circuit included in a semiconductor device for inverter controlling according to Embodiment 3 of the invention.

Embodiment 3 of the invention will now be described. FIG. 5 shows the internal configuration of a PWM signal generation circuit of this embodiment. In this embodiment, the timer 25 of Embodiment 2 is unnecessary.

Figure 6:
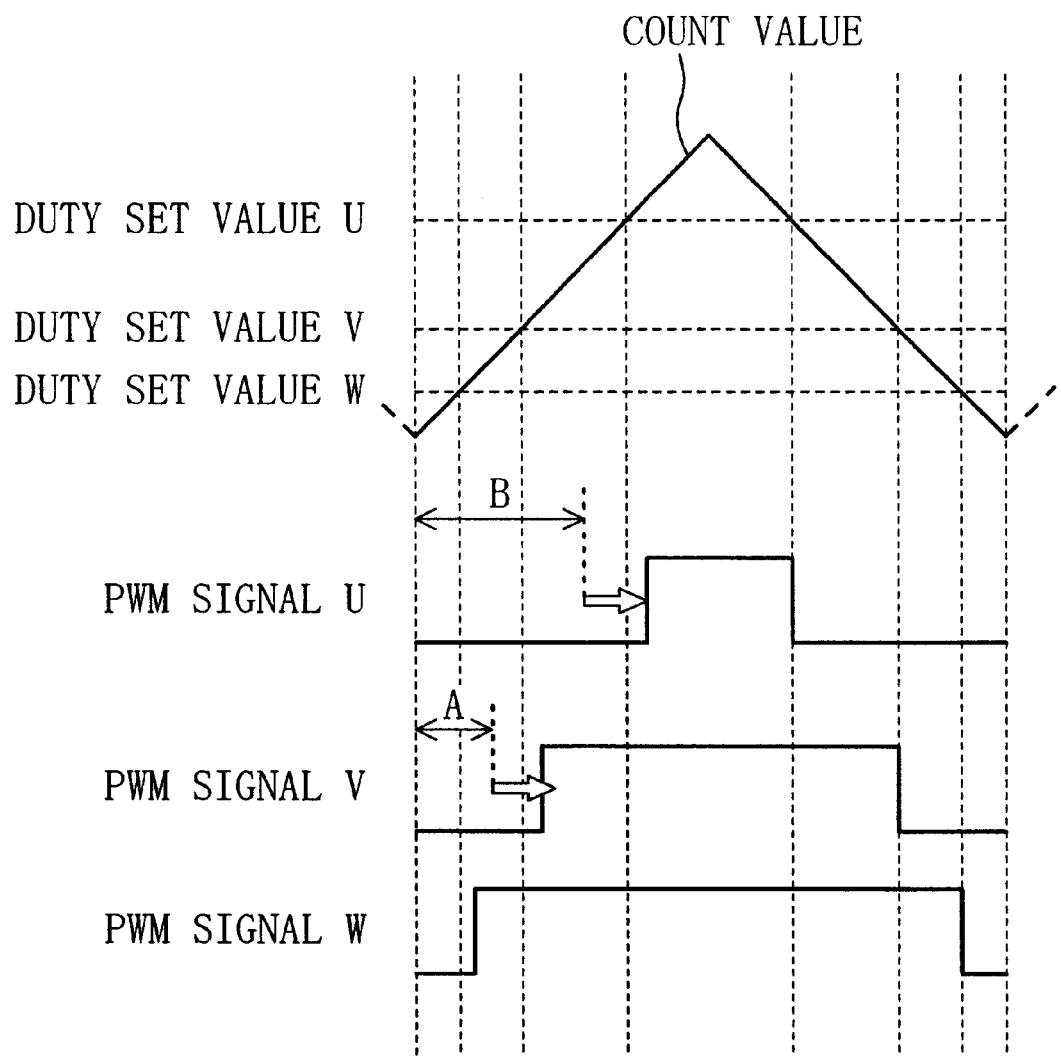
FIG. 6 is a timing chart of a PWM signal and AD conversion in the PWM signal generation circuit of FIG. 5.

Specifically, the PWM signal generation circuit of FIG. 5 includes the timer period set resisters 26 and comparators 28 correspondingly to the AD converters 1g and 1h but does not include the timer 25 of FIG. 3. Instead of the count value of the timer 25, the count value of the counter 3 is input to each comparator 28. Accordingly, the comparator (comparing means) 28 compares the timer period stored in the corresponding timer period set resister 26 with the count value of the counter 3. When the timer period accords with the count value, the comparator 28 outputs an AD conversion start factor to the corresponding AD converter 1g or 1h. Thus, the bit ADST of the AD conversion control resister ADCTR1ga included in the AD converter is set to "1", so as to operate the analog-digital conversion circuit 1gb therein. Similarly to the timer period set resister 22 of Embodiment 1, the timer period stored in each timer period set resister 26 is set by the CPU 1a on the basis of the duty set value stored in any of the duty set resisters (for example, the duty set resistor 7u for the U-phase) to a time in accordance with the duty set value and the predetermined time α or β in every period. For example, as shown in FIG. 6, in the case where a predetermined count value (zero in FIG. 6) of the counter 3 is used as a reference, a timer period A in accordance with the duty set value for the W-phase and the predetermined time α is set in the timer period set resister 26 corresponding to the AD converter 1g, and a timer period B in accordance with the duty set value for the V-phase and the predetermined time α is set in the timer period set register corresponding to the AD converter 1h.

Accordingly, in this embodiment, not only the same effect as that of Embodiment 1 can be attained but also the cost of the PWM signal generation circuit can be further reduced as compared with that of Embodiment 2 because there is no need to additionally include one timer 25. On the other hand, since it is necessary to fetch the count signal of the counter 3 to be output to each comparator 28, the basic configuration of the PWM signal generation circuit shown in FIG. 14 should be changed, and hence, the time required for development of the product is longer than that of Embodiment 2.

Embodiment 4

Figure 7:
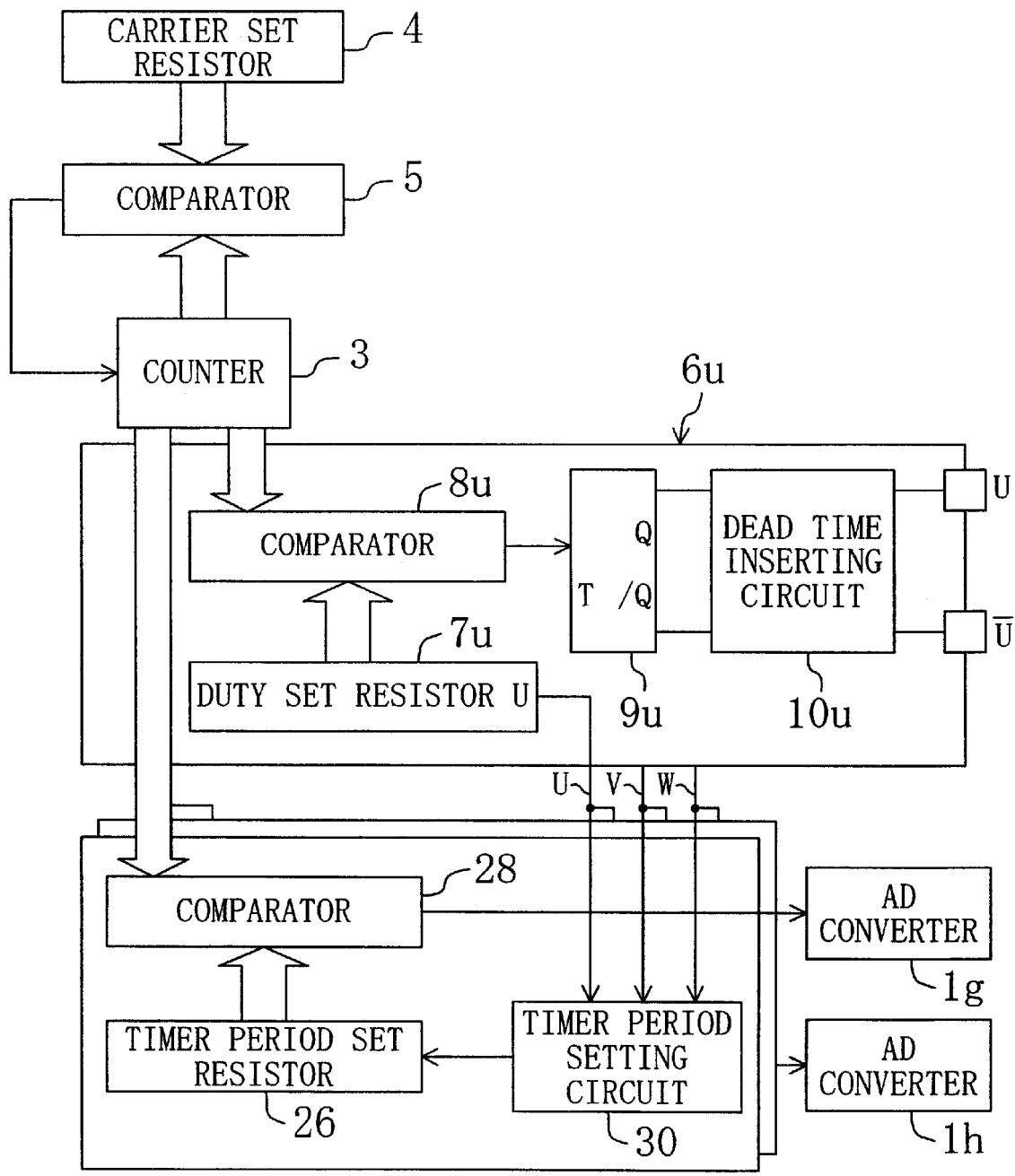
FIG. 7 is a diagram for showing the internal configuration of a PWM signal generation circuit included in a semiconductor device for inverter controlling according to Embodiment 4 of the invention.

Embodiment 4 of the invention will now be described. FIG. 7 shows the internal configuration of a PWM signal generation circuit of this embodiment. In this embodiment, the timer period stored in the timer period set resister 26 of Embodiment 2 is set not by the CPU 1a but by a timer period setting circuit additionally included as a hardware device.

Specifically, in FIG. 7, the timer period setting circuit (timer period setting means) 30 receives the duty set values stored in the duty set resisters (for example, the duty set resistor 7u for the U-phase) of the U-phase, the V-phase and the W-phase, determines a timer period as described above in accordance with a predetermined one of the duty set values and the predetermined time α or β, and stores the timer period in the corresponding timer period set resister 26.

Accordingly, since the timer period setting circuit 30 automatically stores the timer period in the corresponding timer period set resister 26 in this embodiment, the CPU 1a need neither calculate the timer period nor store it in the timer period set resister 26. Thus, the burden of the CPU 1a can be further reduced.

Although the timer period setting circuit 30 is provided in the PWM signal generation circuit of Embodiment 3 in this embodiment, it goes without saying that the timer period setting circuit 30 can be provided in a timing setting circuit 7 or 9 (shown in FIG. 1 or 3) of Embodiment 1 or 2.

Embodiment 5

Ultimately, Embodiment 5 of the invention will be described. In this embodiment, differently from the four embodiments described above, attention is paid to the following: In the case where a dead time is inserted into the same phase of the generated PWM signal, the dead time is inserted at a time when the ON/OFF combination of the U-phase, the V-phase or the W-phase of the PWM signal is changed. In consideration of this fact, the AD conversion of a measured current value is started in this embodiment after a set time has elapsed from insertion of a dead time.

Figure 8:
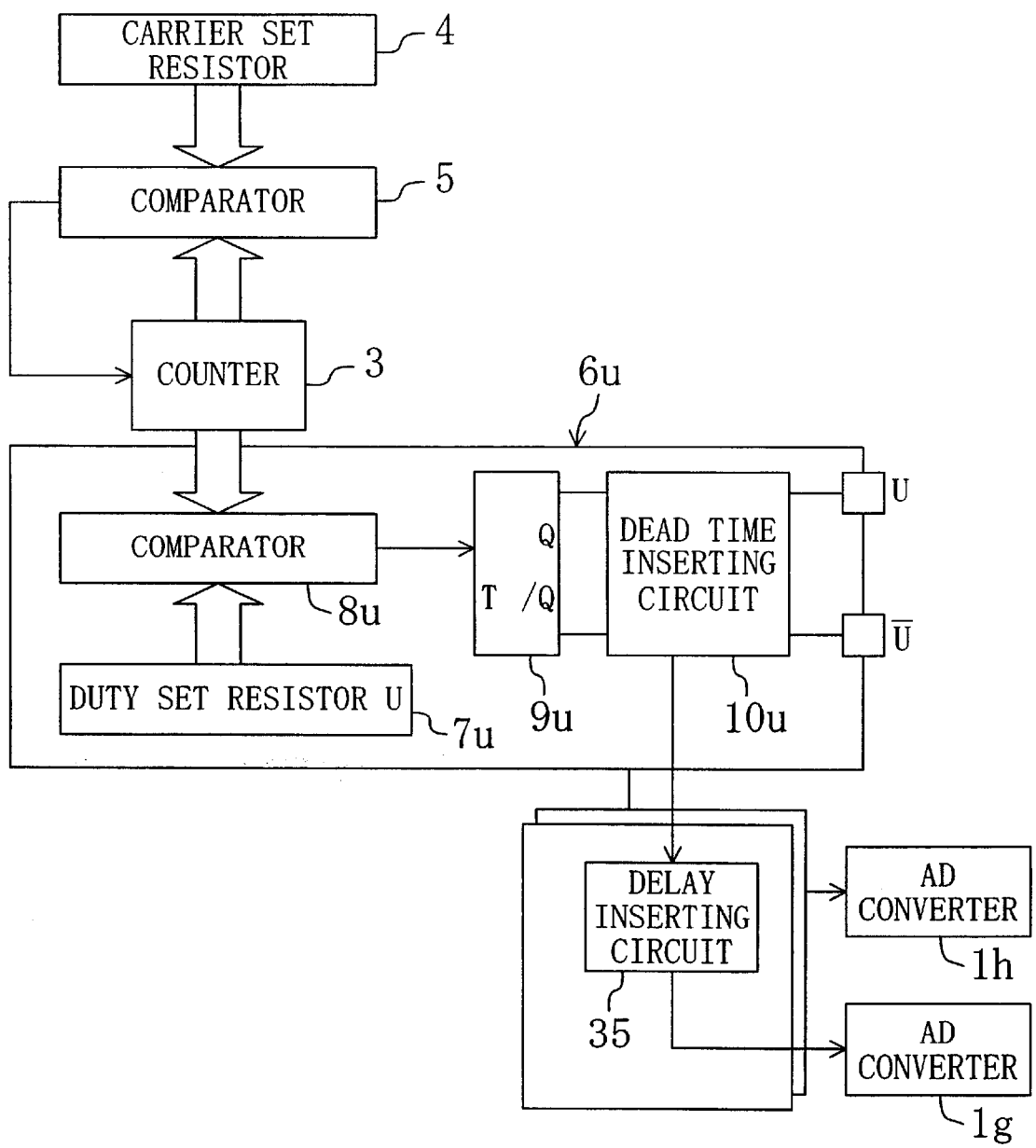
FIG. 8 is a diagram for showing the internal configuration of a PWM signal generation circuit included in a semiconductor device for inverter controlling according to Embodiment 5 of the invention.

FIG. 8 shows the internal configuration of a PWM signal generation circuit of this embodiment. The PWM signal generation circuit of FIG. 8 includes, in addition to the elements of the basic configuration shown in FIG. 14, delay inserting circuits (delay inserting means) 35 respectively corresponding to the AD converters 1g and 1h. The delay inserting circuit 35 corresponding to the AD converter 1g receives the output signal of, for example, the dead time inserting circuit 10u for the U-phase, so as to count a set time γ after the insertion of the dead time by this dead time inserting circuit 10u. Also, the delay inserting circuit 35 corresponding to the AD converter 1h starts to operate in response to, for example, the output signal of the dead time inserting circuit for the V-phase, so as to count a set time δ after the insertion of the dead time. Each of these delay inserting circuits 35 generates an AD conversion start factor when the set time γ or δ has elapsed, and outputs the AD conversion start factor to the corresponding AD converter 1g or 1h. Thus, the bit ADST of the AD conversion control resister ADCTR1ga included in the AD converter is set to "1", so as to operate the analog-digital conversion circuit 1gb therein.

Figure 9:
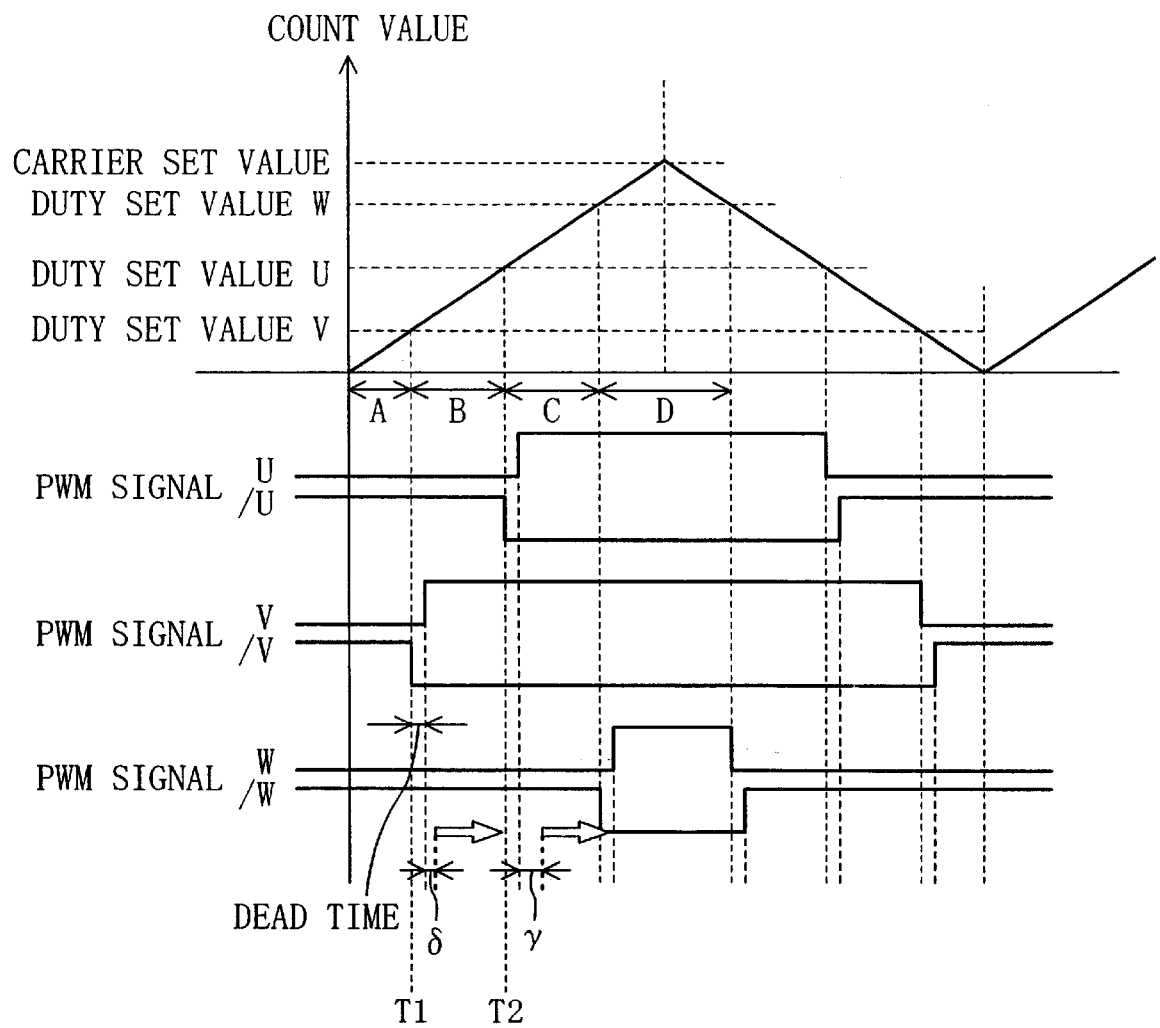
FIG. 9 is a timing chart of a PWM signal and AD conversion in the PWM signal generation circuit of FIG. 8.

Accordingly, in this embodiment, as shown in FIG. 9, when the insertion of the dead time into the V-phase of the PWM signal is started at time T1, the delay inserting circuit 35 corresponding to the V-phase starts to operate after completing the insertion. When the set time δ has elapsed, a signal is output to the corresponding AD converter 1g, so as to start the AD conversion of a supplied current value of the motor M by the AD converter 1g. Similarly, when the insertion of the dead time into the U-phase of the PWM signal is started at time T2, the delay inserting circuit 35 corresponding to the U-phase starts to operate after completing the insertion. When the set time y has elapsed, a signal is output to the corresponding AD converter 1h, so as to start the AD conversion of a supplied current value of the motor M by the AD converter 1h.

Accordingly, also in this embodiment similarly to the embodiments described above, the start timing of the AD conversion by using the AD converters 1g and 1h can be precise as desired. Therefore, a supplied current value of the motor M can be precisely obtained. In addition, the software processing for the interruption of the AD conversion start timing measuring processing and the AD conversion start processing conventionally necessary are unnecessary, so that the delay of the power control and the system control other than the motor control can be effectively suppressed.

At this point, since it is generally necessary to adjust the length of a dead time depending upon a motor or a circuit to be controlled, a circuit for inverter controlling generally includes a timer for measuring a dead time so as to change the length of the dead time, and this timer becomes free after measuring the dead time until the next measurement. Therefore, this timer can be used also for measuring the delay. Accordingly, without separately providing the delay inserting circuit, the AD conversion of a supplied current value of the motor M can be started at a time when a specific ON/OFF combination of the PWM signal is changed.

Although the number of AD converters 1g and 1h is two in the above description, it goes without saying that the number may be three, or four or more if necessary. Furthermore, the application of the invention is not limited to the control of the motor M but the invention is similarly applicable to control of an inverter for any of various devices to be controlled.

What is claimed is:

1. A semiconductor device for inverter controlling comprising:

a PWM signal generation circuit generating a multi-phase PWM signal and including a counter and a duty set resistor for generating said PWM signal;

an AD converter for converting an input analog signal into a digital signal, a pulse width of said PWM signal generated by said PWM signal generation circuit being controlled on the basis of said digital signal obtained through AD conversion by said AD converter;

timer means for automatically start counting time in response to a signal supplied from said counter when said counter has a given count value; and AD conversion start factor generating means for generating an AD conversion start factor for activating said AD converter at a time of a particular ON/OFF combination of said PWM signal when said timer means has counted a set timer period.

2. The semiconductor device for inverter controlling of claim 1, wherein said AD converter is plural in number, and said AD conversion start factor is generated by said AD conversion start factor generating means at each of the time of said particular ON/OFF combination of said PWM signal and a time of at least another particular ON/OFF combination of said PWM signal.

3. The semiconductor device for inverter controlling of claim 2, wherein said timer period of said timer means is calculated on the basis of a duty set value set in said duty set resister, and said AD conversion start factor generating means includes timer period storing means for storing said calculated timer period of said timer means.

4. The semiconductor device for inverter controlling of claim 3, wherein said AD conversion start factor generating means includes said timer means and said timer period storing means respectively in number the same as that of said AD converters, and each of said timer means generates said AD conversion start factor to be output to the corresponding one of said AD converters when said timer means has counted said timer period stored in the corresponding one of said timer period storing means.

5. The semiconductor device for inverter controlling of claim 3, wherein in said AD conversion start factor generating means, the number of said timer means is one and the number of said timer period storage means is the same as that of said AD converters, said AD conversion start factor generating means further includes comparing means in number the same as that of said timer period storing means, and each of said comparing means compares said timer period stored in the corresponding one of said timer period storing means with a count value of said timer means, and generates said AD conversion start factor to be output to the corresponding one of said AD converters when said timer period and said count value compared accord with each other.

6. The semiconductor device for inverter controlling of claim 3, wherein in said AD conversion start factor generating means, the number of said timer period storing means is the same as that of said AD converters, said AD conversion start factor generating means further includes comparing means in number the same as that of and correspondingly to said timer period storing means, and each of said comparing means compares the count value of said counter for generating a PWM signal included in said PWM signal generation circuit with said timer period stored in the corresponding one of said timer period storing means, and generates said AD conversion start factor to be output to the corresponding one of said AD converters when said count value and said timer period compared accord with each other.

7. The semiconductor device for inverter controlling of claim 3, further comprising a CPU, wherein said CPU calculates said timer period stored in said timer period storing means on the basis of said duty set value set in said duty set resister.

8. The semiconductor device for inverter controlling of claim 3, further comprising timer period setting means that receives, from said duty set resistor included in said PWM signal generation circuit, a signal corresponding to said duty set value set in said duty set resistor, determines said timer period of said timer means on the basis of said duty set value, and stores said timer period in said timer period storing means.

9. The semiconductor device for inverter controlling of claim 1, further comprising original timer means, wherein said original timer means works as said timer means of said AD conversion start factor generating means.

10. A semiconductor device for inverter controlling comprising:
- a PWM signal generation circuit generating a multi-phase PWM signal and including a counter, a duty set resistor and a dead time inserting circuit for generating said PWM signal;
- an AD converter for converting an input analog signal into a digital signal, a pulse width of said PWM signal generated by said PWM signal generation circuit being controlled on the basis of said digital signal obtained through AD conversion by said AD converter, and a dead time being inserted into an identical phase of said PWM signal generated by said PWM signal generation circuit;
- delay inserting means that receives an output of said dead time inserting circuit and generates an AD conversion start factor to be output to said AD converter when a set time period has elapsed from insertion of said dead time.

* * * * *